United States Patent [19]

Logwood et al.

[11] Patent Number: 4,679,171
[45] Date of Patent: Jul. 7, 1987

[54] MOS/CMOS MEMORY CELL

[75] Inventors: Dennis J. Logwood, Palo Alto; Mohammed E. U. Haq, Sunnyvale; John A. Reed, Los Altos; Joel A. Karp, Atherton, all of Calif.

[73] Assignee: Visic, Inc., San Jose, Calif.

[21] Appl. No.: 699,051

[22] Filed: Feb. 7, 1985

[51] Int. Cl.$^4$ .................. G11C 11/40; H01L 27/04; H01L 29/78
[52] U.S. Cl. .................. 365/154; 357/23.9; 357/41; 357/59; 357/84
[58] Field of Search .................. 365/154, 182, 188; 357/23.9, 29, 84, 41, 59

[56] References Cited

U.S. PATENT DOCUMENTS 4,234,889 11/1980 Raymond, Jr. et al. .......... 357/23.9
4,481,524 11/1984 Tsujide .................. 357/23.9

FOREIGN PATENT DOCUMENTS 56-107575 6/1981 Japan .................. 357/29
58-199557 11/1983 Japan .................. 357/23.6

Primary Examiner—William D. Larkins
Attorney, Agent, or Firm—Flehr, Hohbach, Test, Albritton & Herbert

[57] ABSTRACT

A memory array of four-IGFET-transistor cells arranged in rows and columns. The array uses two patterned metal layers and two patterned poly-silicon layers. For each column there is a pair of metal differential bit lines, formed on a first patterned metal layer. For each row there is a pair of split equipotential poly-silicon word lines and a parallel metal word line with connections to the split poly word lines at defined intervals. The parallel metal word line is on a second patterned metal layer distinct from the metal layer used for the bit lines. A grounded poly-silicon plate overlies the capacitive memory nodes of said array. The grounded poly-silicon plate is on a second patterned poly-silicon layer distinct from the poly-silicon layer used for the split word lines. The poly-silicon plate is connected to the circuit ground at defined intervals. Also, the poly-silicon plate provides alpha particle protection to the array and helps decouple the bit lines from the capacitive nodes of the array.

9 Claims, 4 Drawing Figures

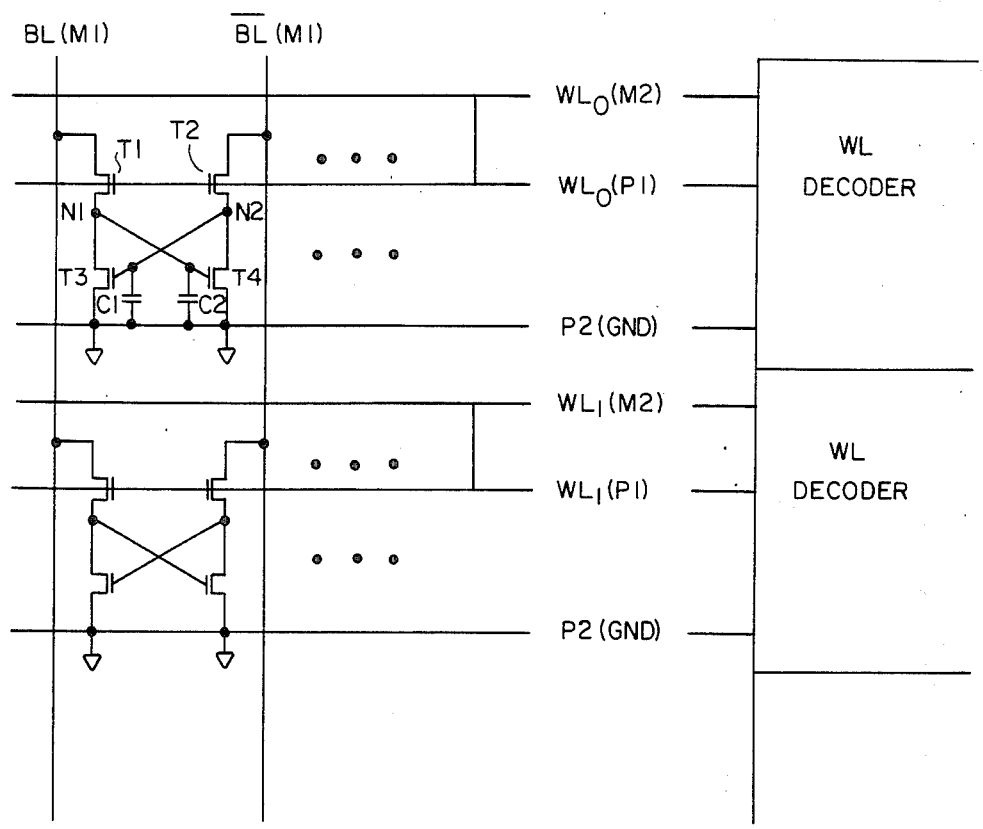
FIG.—1
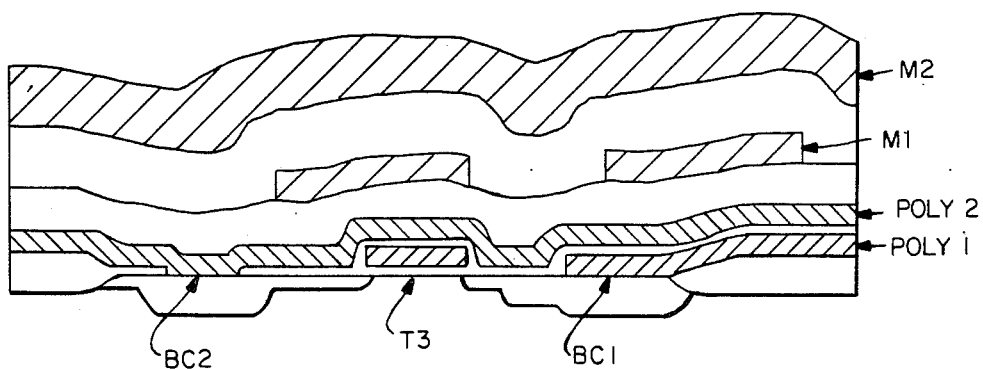
FIG.—4

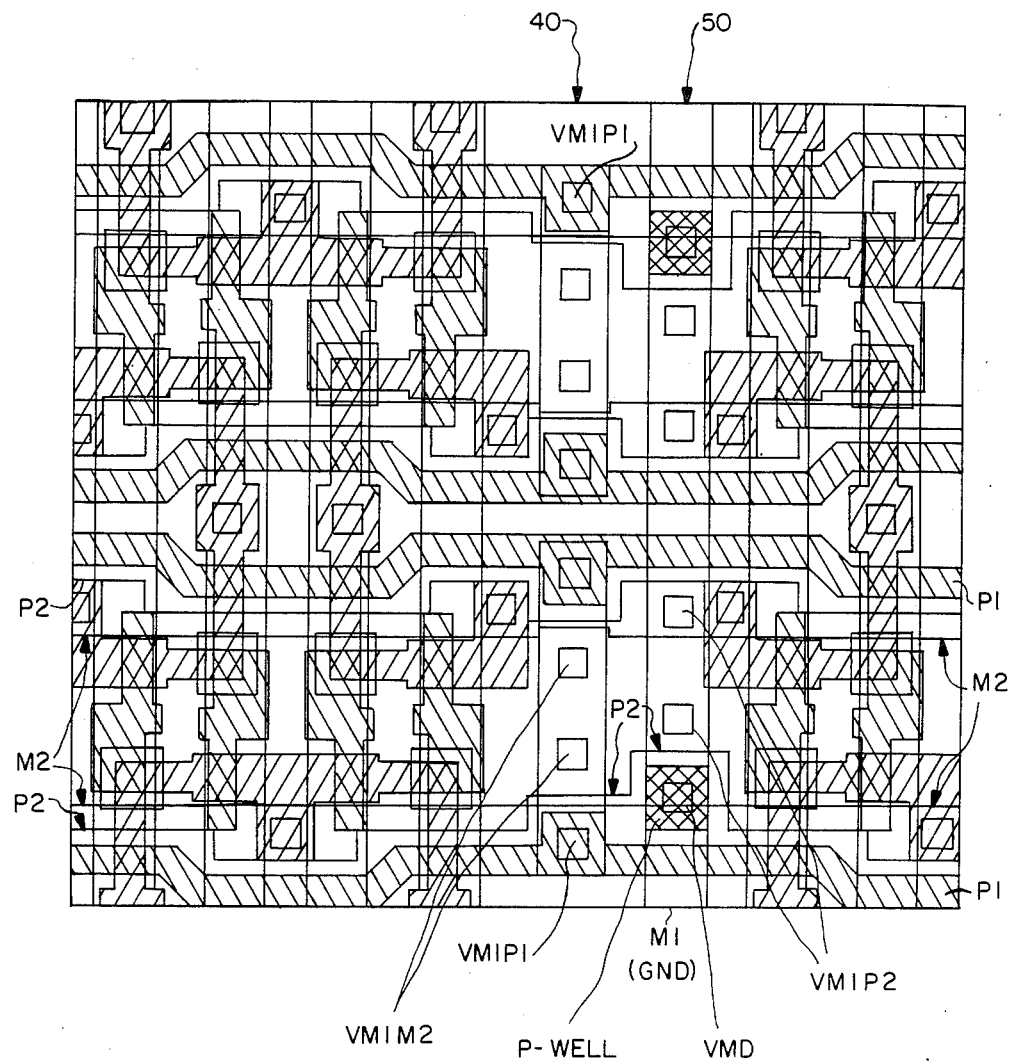
FIG.—3

MOS/CMOS MEMORY CELL

The present invention relates generally to MOS and CMOS memory cells and particularly to an improved four-IGFET-transistor memory cell.

The prior art includes a large number of four transistor dynamic and static MOS and CMOS (i.e., IGFET, insulated gate field effect transistor) memory cells. With all such memory cells, the goal of the designer is minimize cell area (or ratio of cell area to cell capacitance), access time, and susceptibility to alpha particle radiation. Other goals include minimizing the capacitive coupling of the bit lines to the memory cells and maximizing the symmetry of the memory cells. This invention relates to a memory cell geometry which provides improvements with respect to all these goals.

Generally, it is accepted that metal connections for bit lines and/or word lines in such memories provide faster access paths than poly-silicon lines. However, very few prior art memories have used both metal bit and metal word lines due to problems in the production of such devices.

Also, a variety of attempts have been made to improve (i.e., minimize) the ratio of cell area to cell capacitance by using V-groove type geometries and/or by providing an AC-grounded (i.e., steady voltage) plate above at least a portion of the memory cells.

Finally, susceptibility to alpha particle radiation is solved partially by maintaining cell capacitance at a high enough level to withstand the charge leakage caused by even direct alpha particle hits and by placing CMOS memory cells in p-wells which, by their nature, sweep alpha particle induced charges away from the memory cell's capacitive node. Such memory devices are still subject to "soft" errors caused by glancing collisions of alpha particles with memory cells, because glancing collisions do not penetrate deeply into the chip and therefore cause a larger amount of charge to accumulate on the memory cell node than more obtuse alpha particle collisions.

It is therefore a primary object of the invention to provide an improved MOS and CMOS memory cell.

Other objects of the invention are to provide a memory cell which provides for both metal bit lines and metal word lines, and to provide a grounded poly-silicon plate over the memory cell array which both protects against glancing alpha particle collisions and increases cell capacitance.

In summary, the invention is an improved memory array of four-IGFET-transistor cells arranged in rows and columns. The array uses two patterned metal layers and two patterned poly-silicon layers. For each column there is a pair of metal differential bit lines, formed on a first patterned metal layer. For each row there is a pair of split equipotential poly-silicon word lines and a parallel metal word line with connections to the split poly word lines at defined intervals. The parallel metal word line is on a second patterned metal layer distinct from the metal layer used for the bit lines. A grounded poly-silicon plate overlies the capacitive memory nodes of said array. The grounded poly-silicon plate is on a second patterned poly-silicon layer distinct from the poly-silicon layer used for the split word lines. The poly-silicon plate is connected to the circuit ground at defined intervals. Also, the poly-silicon plate provides alpha particle protection to the array and helps decouple the bit lines from the capacitive nodes of the array, as well as providing a ground connection for each memory cell.

Additional objects and features of the invention will be more readily apparent from the following detailed description and appended claims when taken in conjunction with the drawings, in which:

FIG. 1 depicts a circuit schematic of a memory array in accordance with the invention.

FIG. 3 depicts a multi-layer composite drawing of a second portion of a memory cell layout in accordance with the invention.

FIG. 4 depicts a cross-section of a memory cell in accordance with the invention.

Figure 2:
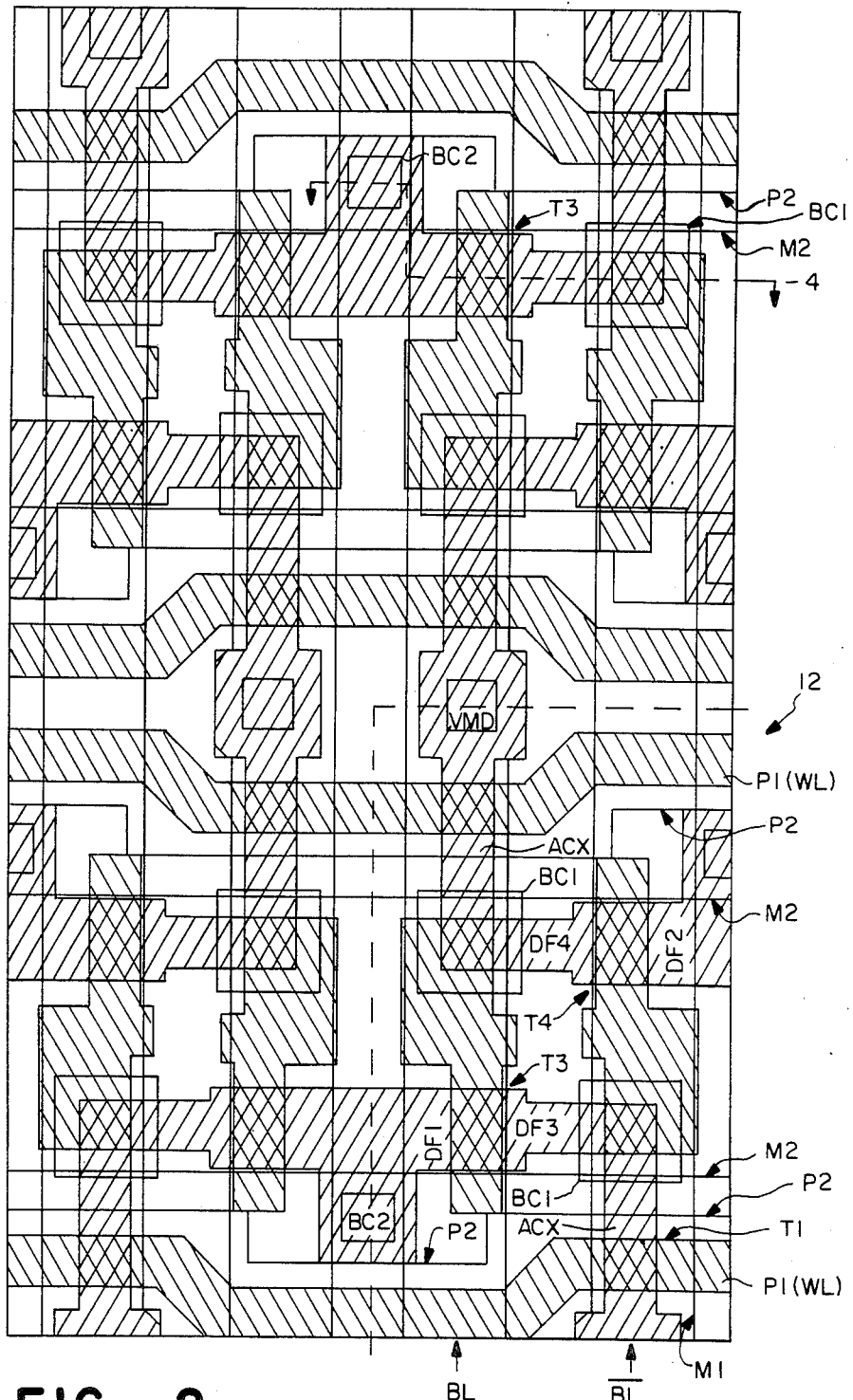
FIG. 2 depicts a multi-layer composite drawing of a first portion of a memory cell layout in accordance with the invention.

Referring to FIG. 1, the invention comprises an semiconductor memory array of 4-IGFET (insulated gate field effect transistor) cells. The improvement comprising the invention lies in the particular design and organization of the array and cells.

The four transistors T1, T2, T3 and T4 in each cell of the preferred embodiment are n-channel MOS transistors. Further, the array is intended for use in a CMOS memory device, wherein the peripheral circuitry for the memory includes both p-channel and n-channel transistors.

As is standard for CMOS memory devices, the array resides in a large p-well which is formed in an N-substrate. The p-well is grounded and the N- substrate is back biased. Thus, charges induced by alpha particles burying into the p-well are swept into the substrate and away from the capacitive nodes of the memory array.

Capacitors C1 and C2 are formed by a grounded poly-silicon plate P2 which overlies the cells. In the preferred embodiment, these capacitors account for approximately 60% of the capacitance of each capacitive node N1 and N2 of the cell. In other words, the grounded poly-silicon plate P2 approximately doubles the charge storage capacity of the memory cells without increasing the size of the cells.

Note that inverse signals which are indicated by an overscore in the drawing are indicated by an underscore in this description.

The memory array of the invention provides differential metal bit lines BL and BL for each column, formed on a first layer of patterned metal (labelled M1). As is well known to those skilled in the art, differential bit lines provide faster access than single ended bit lines. Furthermore, metal bit lines speed memory access considerably compared to poly-silicon bit lines and are simpler to fabricate than poly-silicon-silicide bit lines.

Although not shown in FIG. 1, the preferred embodiment of the invention uses split poly-silicon word lines $WL_x$—one for each access transistor T1 and T2. More importantly, the poly-silicon word lines are paralleled by metal word lines on a second metal layer.

The metal word lines contact the poly-silicon word lines once every 32 cells. The use of metal word lines greatly reduces memory access time compared to the use of poly-silicon word lines because of reduced resistance. However, the use of split poly-silicon word lines is extremely convenient for efficient cell layout (i.e., with a high ratio of cell capacitance to cell area). The solution is to use both poly and metal word lines in parallel. As will be shown in FIG. 2, the preferred embodiment of the invention includes a cell layout which is symmetrical with respect to the split poly-silicon word lines.

The next consideration is how often to interconnect the poly and metal word lines. The goals are to minimize the amount of silicon real estate used and yet to insure that no appreciable access time delay (e.g., an additional 10 percent delay) is caused by the r-c time constant of the poly-silicon word lines. As a practical matter, given poly-silicon resistivities of around 30 ohms/square and poly-silicon line widths of around 2 microns, interconnection is needed only every 200 to 400 microns. Further, with cell geometry sized on the order of 10 microns, interconnection is needed only every 20 to 40 cells (i.e., every 20 to 40 columns). In the preferred embodiment, the metal and poly-silicon word lines are interconnected only every 32 columns. The preferred rate of interconnecting the metal and poly word lines using available CMOS technologies may vary from as often as every 8 to as seldom as every 128 columns, depending on the cell width, the poly-silicon resistivity, the width of the poly-silicon word lines, the capacitance of the poly-silicon word lines, and the designer's preferred tradeoff between usage of extra silicon area for interconnections and the access time delay which is attributable to the poly-silicon word lines' resistance.

Referring to FIG. 2, there is shown the layout of four memory cells, one of which is labelled to correspond to the labelling of the circuit shown in FIG. 1. The darkest shaded area is the first poly-silicon layer (P1). The lightly shaded area represents N+ diffusion. As is traditional in such drawings, the areas where P1 areas cross diffusion areas represent MOS transistors.

First layer metal M1 bit lines BL and $\overline{BL}$ run in the column direction. Second layer metal M2 lies on top of first layer metal M1 (isolated, of course by silicon dioxide and/or silicon nitride insulatory layer(s)) and is not contacted by the circuitry in the cells.

First layer poly-silicon P1 forms the split word lines WL and the gates of all the cell transistors T1, T2, T3 and T4. Second layer poly-silicon P2 lies on top of the first layer poly-silicon P1 (isolated, of course, by silicon dioxide and/or silicon nitride insulatory layer(s)). P2 is grounded by means of periodic connections (VM1P2) to the circuit ground, as will be shown in the discussion of FIG. 3. P2 connects to two diffusion areas DF1 and DF2 of each cell. These grounded diffusion areas DF1 and DF2 are each shared by two cells (except for certain diffusion areas at the edge of each sub-array of cells (see FIG. 3).

The second layer poly-silicon P2 is further designed to cover the capacitive nodes of the cells, on which the cells depend for their memory retention properties. This P2 layer increases the cell capacitance by providing an AC-grounded (i.e., stable voltage) capacitor plate for the capacitive nodes N1 and N2, and thereby increases the ratio of cell capacitance to cell area. The poly-silicon P2 plate also substantially decouples the bit lines from the capacitive nodes of the cells. Only a small fraction of each capacitive node (e.g., the area labelled ACX) is not shielded from the overlying bit line.

In the preferred embodiment, the P1 and P2 poly-silicon layers are separated by an insulator which is approximately 1000 angstroms thick, whereas the gate oxide separating P1 from the transistor channels is approximately 275 to 300 angstroms thick. The P2 poly-silicon plate forms a capacitor (see capacitors C1 and C2 in FIG. 1) of approximately 15 femtofarads with each capacitive node in the array. The total capacitance of each capacitive node is approximately 25 femtofarads. In other embodiments, the thickness of the insulator between P1 and P2 can be varied so as to control the charge storage capacity of the cells. While in general the P2 plate will normally be used to contribute at least 25 percent of the cell's capacitance, considerably higher cell storage capacitance can be achieved by decreasing the thickness of the insulator between P1 and P2.

The P2 layer also provides some protection against alpha particles impinging on the array at acute (i.e., glancing) angles. Such glancing alpha particles are the hardest to protect against in any IGFET-type memory array because the induced charges tend to be generated in the vicinity of the cell's capacitive node. However, the provision of a grounded P2 layer reduces the danger of soft errors caused by such alpha particles. Note that deeper penetrating alpha particles, which impinge on the semiconductor surface at a more obtuse angle, tend to generate electrical charges in the p-well where they are swept into the N- substrate and away from the capacitive nodes of the cells.

Two types of buried contacts are used in the preferred embodiment. BC1 areas provide contact between diffusion and P1. BC2 areas provide contact between diffusion and P2.

Contacts between diffusion and M1 are provided by standard contact masking procedures, which are used to produce the vias labelled VMD in FIGS. 2 and 3.

A further advantage of the cells shown in FIG. 2 are their relatively long length in the bit line direction (e.g., about 19 microns in the preferred embodiment) compared to their width (e.g., about 10 microns), which facilitates the layout of adequate strength word line decoders.

Furthermore, as shown in FIG. 2, in the preferred embodiment, the memory cells are symmetric with respect to the split poly-silicon P1 word lines.

Referring to FIG. 3, there is shown the portion of the memory array layout where the circuit ground is connected to the P2 plate and to the p-well, and where the M2 word lines are connected to the split poly-silicon P1 word lines.

In the column generally identified by numeral 40, M2 is connected to M1 by means of two vias labelled VM1M2. Also, M1 is connected to P1 by means of vias labelled VM1P1. Therefore the M2 word lines are connected to the P1 word lines indirectly through first layer metal M1.

Metal column line 50 is an M1 line, parallel to the bit lines, which acts as a ground line. The M1 column 50 is connected to the grounded p-well by means of a contact VMD in each row (which is formed in the same processing steps as the contacts labelled VMD in FIG. 2. THe P2 plate is then connected to M1 by means of vias VM1P2.

Referring to FIG. 4, there is shown a cross-section of a memory cell, as identified by section line 4 in FIG. 2. As can be seen, the P2 layer is located so as to provide a significant portion of the memory cell's capacitance. The P2 layer also shields the memory cell from the M1 bit lines and is located so as to help absorb alpha particle radiation.

Given the layout shown in FIGS. 2 and 3, and the cross-section shown in FIG. 4, a memory array in accordance with the invention can be manufactured using well known manufacturing techniques and therefore a process for the manufacture of such a memory device is not described herein.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the p-well could be back biased in an alternate embodiment of the invention. Also, the invention is equally applicable to dynamic and static memories, and should also apply to other circuit technologies than the MOS technology used in the preferred embodiment.

What is claimed is:

1. A semiconductor memory array, having a plurality of four-IGFET-transistor memory cells arranged in rows and columns, each said cell having two cross coupled transistors with cross coupled gates and drains, and two access transistors for coupling the drains of said cross coupled transistors to differential bit lines, comprising:

a substrate;

first and second patterned metal layers on said substrate;

first and second patterned poly-silicon layers on said substrate;

for each row, a pair of equipotential poly-silicon word lines and a parallel metal word line which is electrically connected to both of said equipotential poly-silicon word lines at defined intervals along said word line; said parallel word line being formed on said second patterned metal layer; said poly-silicon word lines being formed on said first poly-silicon layer; each of said pair of equipotential poly-silicon word lines forming the gate of one of said two access transistors in each of said cells in the corresponding row of memory cells; and a grounded poly-silicon plate overlying the capacitive memory nodes of said array; said grounded poly-silicon being formed on said second patterned poly-silicon layer and also providing a ground connection to each of said cells;

for each column, a pair of differential metal bit lines coupled to said access transistors for the cells in said column, said metal bit lines being formed on said first patterned metal layer after the formation of said poly-silicon plate;

wherein said grounded poly-silicon plate provides alpha particle protection to said array and substantially decouples said capacitive memory nodes from said bit lines.

2. A semiconductor memory array as set forth in claim 1, wherein said IGFET transistors are n-channel MOS transistors.

3. A semiconductor memory array as set forth in claim 2, said memory array including:

a p-well in said substrate; said array being placed in said p-well;

wherein said p-well is tied to ground and is surrounded by a higher voltage potential n-substrate, whereby electrical charges induced by alpha particles in said p-well tend to be swept away from the capacitive nodes in said memory array.

4. A semiconductor memory array as set forth in claim 3, wherein said grounded poly-silicon plate is electrically connected to the circuit ground at defined intervals throughout said memory array.

5. A semiconductor memory array as set forth in claim 1, wherein said memory cells are symmetrical with respect to said equipotential poly-silicon word lines.

6. A semiconductor memory array as set forth in claim 1, wherein each said cell has two capacitive nodes and said grounded poly-silicon plate provides at least half of the charge storage capacity of said capacitive nodes.

7. A CMOS memory array, having a plurality of four-transistor memory cells arranged in rows and columns, each said cell having two cross coupled transistors with cross coupled gates and drains, and two access transistors for coupling the drains of said cross coupled transistors to differential bit lines, comprising:

a substrate having a N-background;

a p-well in said substrate; said array being placed in said p-well;

first and second patterned metal layers on said substrate;

first and second patterned poly-silicon layers on said substrate;

for each column, a pair of metal differential bit lines, said metal bit lines being part of said first patterned metal layer;

for each row, a pair of equipotential poly-silicon word lines and a parallel metal word line with connections to said poly-silicon word lines every N cells, where N is an integer greater than 7 and less than 129; said parallel word line being part of said second patterned metal layer; said poly-silicon word lines being formed on said first poly-silicon layer; each of said pair of equipotential poly-silicon word lines forming the gate of one of said two access transistors in each of said cells in the corresponding row of memory cells; and a grounded poly-silicon plate overlying the capacitive memory nodes of said array; said grounded poly-silicon being part of said second patterned poly-silicon layer and also providing a ground connection to each of said cells;

wherein said grounded poly-silicon plate provides alpha particle protection to said array and substantially decouples said capacitive memory nodes from said bit lines.

8. A semiconductor memory array having a plurality of memory cells arranged in rows and columns, each said memory cell having at least one IGFET transistor, comprising:

a substrate having a N- background connected to a first fixed voltage potential source;

a p-well in said substrate; said array being placed in said p-well;

first and second patterned poly-silicon layers on said substrate;

first and second patterned metal layers formed on said substrate after the formation of said poly-silicon layers;

for each column, a metal bit line formed on said first patterned metal layer;

for each row, a poly-silicon word line and a parallel metal word line which is electrically connected to said poly-silicon word line at defined intervals along said word line; said parallel word line being formed on said second patterned metal layer; said poly-silicon word line being formed on said first poly-silicon layer;

a poly-silicon plate overlying the capacitive memory nodes of said array; said poly-silicon plate being formed on said second patterned poly-silicon layer;

a plurality of ground lines, formed on said first patterned metal layer, which are coupled to a second fixed voltage potential source (ground) which is at a lower voltage than said first fixed voltage potential source; said ground lines being coupled to both said poly-silicon plate and said p-well at defined intervals;

wherein said poly-silicon plate is coupled to the source of at least one transistor in each of said memory cells, thereby providing a connection for said memory cells to said second fixed voltage potential source (ground);

said poly-silicon plate provides alpha particle protection to said array and substantially decouples said capacitive memory nodes from said bit lines;

the voltage differential between said p-well and the surrounding substrate causes electrical charges induced by alpha particles in said p-well to be swept away from the capacitive nodes in said memory array; and each said memory cell includes four IGFET transistors, each said cell having two cross coupled transistors with cross coupled gates and drains, and two access transistors for coupling the drains of said cross coupled transistors to differential bit lines; and for each row, said poly-silicon word line includes a pair of equipotential poly-silicon word lines; said parallel metal word line being electrically connected to both of said equipotential poly-silicon word lines at defined intervals along said word line; each of said pair of equipotential poly-silicon word lines forming the gate of one of said two access transistors in each of said cells in the corresponding row of memory cells.

9. A semiconductor memory array as set forth in claim 8, wherein said memory cells are symmetrical with respect to said equipotential poly-silicon word lines.

* * * * *